US012777716B2

(12) United States Patent
Li et al.

(10) Patent No.: US 12,777,716 B2
(45) Date of Patent: Oct. 27, 2026

(54) ARRAY SUBSTRATE, DISPLAY PANEL, AND ELECTRONIC DEVICE

(71) Applicants: Beijing BOE Display Technology Co., Ltd., Beijing (CN); BOE Technology Group Co., Ltd., Beijing (CN)

(72) Inventors: Xiaoying Li, Beijing (CN); Zhixiao Yao, Beijing (CN); Weitao Chen, Beijing (CN); Yu Ma, Beijing (CN); Yan Yan, Beijing (CN); Xiaopeng Cui, Beijing (CN); Xiaoyi Zheng, Beijing (CN); Xiao Wang, Beijing (CN); Zhiqiang Ma, Beijing (CN); Bo Li, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 407 days.

(21) Appl. No.: 18/688,052

(22) PCT Filed: Dec. 26, 2022

(86) PCT No.: PCT/CN2022/141855

§ 371 (c)(1),
(2) Date: Feb. 29, 2024

(87) PCT Pub. No.: WO2024/138303

PCT Pub. Date: Jul. 4, 2024

(65) Prior Publication Data

US 2025/0126891 A1 Apr. 17, 2025

(51) Int. Cl.

| | |
|---|---|
| ***H01L 29/04*** | (2006.01) |
| ***H01L 29/10*** | (2006.01) |

(Continued)

(52) U.S. Cl.
CPC ........... *H10D 86/443* (2025.01); *H10D 86/60* (2025.01)

(58) Field of Classification Search
CPC ...... H10D 86/443; H10D 86/60; H10D 86/40; H10D 86/441; H10D 30/6757;
(Continued)

(56) References Cited

U.S. PATENT DOCUMENTS

2015/0092132 A1* 4/2015 Kang .................. H10D 86/441 438/34
2022/0050340 A1* 2/2022 Zang ................ G02F 1/134336
(Continued)

FOREIGN PATENT DOCUMENTS

CN 102436103 A * 5/2012
CN 104597643 A 5/2015
(Continued)

OTHER PUBLICATIONS

PCT/CN2022/141855 international search report dated Feb. 13, 2023.
PCT/CN2022/141855 Written Opinion dated Feb. 13, 2023.

*Primary Examiner* — Niki H Nguyen
(74) *Attorney, Agent, or Firm* — IPro, PLLC

(57) ABSTRACT

The present disclosure relates to an array substrate, a display panel, and an electronic device. The array substrate includes a plurality of sub-pixel regions, a gate line layer, and a common electrode layer. Each sub-pixel region of the sub-pixel regions has two sub-pixel units disposed in a same row and two thin film transistors connected to the two sub-pixel units respectively. The gate line layer has gate lines and gate electrodes. Control electrodes of two thin film transistors of each sub-pixel region are respectively connected to two gate lines located on two ends of the sub-pixel region through corresponding gate electrodes.

20 Claims, 9 Drawing Sheets

(51) Int. Cl.

| | |
|---|---|
| ***H01L 31/00*** | (2006.01) |
| ***H10D 86/40*** | (2025.01) |
| ***H10D 86/60*** | (2025.01) |

(58) Field of Classification Search

CPC ............. H10D 30/031; H10D 30/6734; H10D 30/6733; H10D 30/67; H10D 86/0221; H10D 86/471; H10D 86/021; H10D 89/811; H10D 30/6732; H10D 86/431; H10D 86/425; H10D 30/0314; H10D 30/0318; H10K 59/131; H10K 59/95; H10K 59/121; H10K 59/1213; H10K 59/1216; H10K 59/122; H10K 59/35; H10K 59/80; H10K 59/124; H10K 59/351; H10K 59/10; H10K 50/00; H10K 59/60; H10K 50/8428; H10K 59/8723; H10K 50/10; H10K 2102/311; H10K 59/127; H10K 39/34; H10K 2102/302; H10K 59/80516

See application file for complete search history.

(56) References Cited

U.S. PATENT DOCUMENTS

2024/0213272 A1* 6/2024 Cheng .................... H10D 86/60
2024/0219786 A1* 7/2024 Huang ................. H10D 86/451

FOREIGN PATENT DOCUMENTS

| | | | |
|---|---|---|---|
| CN | 103022141 | B | 4/2016 |
| CN | 110687730 | A | 1/2020 |
| CN | 113253529 | A | 8/2021 |
| CN | 215576040 | U | 1/2022 |

* cited by examiner

ARRAY SUBSTRATE, DISPLAY PANEL, AND ELECTRONIC DEVICE

CROSS-REFERENCE TO RELATED APPLICATIONS

The present disclosure is a U.S. national phase of PCT Application No. PCT/CN2022/141855 filed on Dec. 26, 2022 which is hereby incorporated by reference in its entirety.

TECHNICAL FIELD

The present disclosure pertains to a field of display technology, and particularly relates to an array substrate, a display panel, and an electronic device.

BACKGROUND

With continuous upgrading of an ultra-high-definition video industry, performances of displays on a market are increasingly high. Because a dual gate pixel structure may save a half of the number of Source ICs (integrated circuit), many thin film transistor liquid crystal displays (TFT-LCDs) use the dual gate pixel structure. However, jump of a gate voltage affects pixel voltage fluctuation and leads to a difference in brightness for each column of pixels under different polarities. When a user shakes his/her head and observes a display screen, it is easy to lose frames and see vertical lines (head shaking lines), affecting a display effect of the screen and usage experience of the user.

SUMMARY

According to a first aspect of embodiments of the present disclosure, an array substrate is provided. The array substrate includes:

a plurality of sub-pixel regions arranged in an array, wherein each sub-pixel region of the sub-pixel regions has two sub-pixel units disposed in a same row and two thin film transistors correspondingly connected to the two sub-pixel units respectively;

a gate line layer, having gate lines and gate electrodes connected to the gate lines and opposite to the thin film transistors; wherein there is a gate line on each of two opposite sides of each row of sub-pixel regions; control electrodes of two thin film transistors of each sub-pixel region are respectively connected to two gate lines located on two sides of the sub-pixel region through gate electrodes respectively corresponding to the control electrodes; and, for two sub-pixel units of each of at least a part of the sub-pixel regions, one sub-pixel unit is connected to a first electrode of a corresponding thin film transistor through a longer first connecting portion, and the other sub-pixel unit is connected to a first electrode of a corresponding thin film transistor through a shorter second connecting portion; wherein an extending direction of the first connecting portion is consistent with an extending direction of a gate line connected to the corresponding thin film transistor; and a common electrode layer, including an electrode line body and a shielding portion connected to the electrode line body, wherein the shielding portion is located above the first connecting portion and/or the shielding portion is located above the gate line connected to the thin film transistor corresponding to the first connecting portion.

In some embodiments, the array substrate has a plurality of data lines; there is a column of sub-pixel regions between two adjacent data lines; there are two gate lines between two adjacent rows of sub-pixel regions; in a same column of sub-pixel regions, respective first connecting portions of at least one set of two adjacent rows of sub-pixel regions are disposed opposite to each other; the shielding portion is disposed above the two gate lines between the respective first connecting portions of the two adjacent rows of sub-pixel regions.

In some embodiments, the shielding portion includes a first portion located above one of the gate lines between the respective first connecting portions of the two adjacent rows of sub-pixel regions, and a second portion located above the other one of the gate lines between the respective first connecting portions of the two adjacent rows of sub-pixel regions, respectively.

In some embodiments, a connecting portion is disposed between the first portion and the second portion.

In some embodiments, a dimension, in a transverse direction, of the connecting portion is consistent with dimensions, in the transverse direction, of the first portion and the second portion.

In some embodiments, for the shielding portion located above the gate line connected to the thin film transistor corresponding to the first connecting portion, an edge of an orthographic projection of the shielding portion in a thickness direction of the array substrate is closer to the first connecting portion, than an edge of an orthographic projection of the gate line in the thickness direction of the array substrate.

In some embodiments, the edge of the orthographic projection of the shielding portion in the thickness direction of the array substrate is apart from the first connecting portion by a first distance; the edge of the orthographic projection of the gate line in the thickness direction of the array substrate is apart from the first connecting portion by a second distance; and a difference between the first distance and the second distance is 1.5 μm-3 μm.

In some embodiments, an overlap width, in a longitudinal direction, between the shielding portion and a corresponding gate line is 2.5 μm-3.5 μm.

In some embodiments, there is a third connecting portion between the shielding portion and the electrode line body.

In some embodiments, the third connecting portion extends in a longitudinal direction.

In some embodiments, the third connecting portion is inclined.

In some embodiments, an end, away from the shielding portion, of the third connecting portion is inclined towards a side where the corresponding thin film transistor is located.

In some embodiments, an angle between the third connecting portion and a transversely extending side of the shielding portion, is greater than 90 degrees and less than 180 degrees.

In some embodiments, a gate line corresponding to the third connecting portion has an avoidance notch on a side, where the first electrode of the thin film transistor is located, of a corresponding gate electrode; the avoidance notch has an edge portion away from the gate electrode; a portion of the third connecting portion located on a side, close to the shielding portion, of a transverse centerline of the first connecting portion is located on a side, away from the thin film transistor, of the edge portion; or, the portion of the third connecting portion located on the side, close to the shielding portion, of the transverse centerline of the first connecting portion is aligned with the edge portion.

In some embodiments, the first connecting portion has a connecting body extending in a transverse direction and a connecting end portion that is connected to the connecting body and the first electrode of the thin film transistor and extends in a longitudinal direction; the connecting end portion has a side edge away from the thin film transistor; a portion of the third connecting portion located on a side, close to the shielding portion, of a transverse centerline of the first connecting portion is located on a side, away from the thin film transistor, of the side edge; or, the portion of the third connecting portion located on the side, close to the shielding portion, of the transverse centerline of the first connecting portion is aligned with the side edge.

In some embodiments, an orthographic projection of the shielding portion in a thickness direction of the array substrate is spaced by 2 micrometers or more from the corresponding thin film transistor.

In some embodiments, the first connecting portion has a connecting body extending in a transverse direction and a connecting end portion that is connected to the connecting body and the first electrode of the thin film transistor and extends in a longitudinal direction; for a case where the shielding portion is located above the first connecting portion, the shielding portion is located above the connecting body.

In some embodiments, an edge of an orthographic projection of the shielding portion in a thickness direction of the array substrate is closer to a corresponding gate line, than an edge of an orthographic projection of the connecting body in the thickness direction of the array substrate.

In some embodiments, the edge of the orthographic projection of the shielding portion in the thickness direction of the array substrate is apart from the corresponding gate line by a third distance between; the edge of the orthographic projection of the connecting body in the thickness direction of the array substrate is apart from the corresponding gate line by a fourth distance; and a difference between the third distance and the fourth distance is 3 μm-5 μm.

In some embodiments, a thickness of the gate line ranges from 0.4 micrometers to 0.5 micrometers.

According to a second aspect of embodiments of the present disclosure, a display panel is provided. The display panel includes the array substrate as described above According to a third aspect of embodiments of the present disclosure, an electronic device is provided. The electronic device includes the display panel as described above The above array substrate, the display panel, and the electronic device provided by the present disclosure, reduce or eliminate the capacitance between the longer first connecting portion and the corresponding gate line relative to the shorter second connecting portion, by disposing the common electrode layer to have the shielding portion located above the first connecting portion and/or above the gate line connected to the thin film transistor corresponding to the first connecting portion, and then reduce a voltage variation value caused by using connecting portions with different lengths to connect thin film transistors during the operation of the array substrate, thereby reducing the phenomenon of the vertical lines in the display screen having such an array substrate.

It should be understood that the above general description and the detailed description in the following text are only exemplary and explanatory, and cannot limit the present disclosure.

DETAILED DESCRIPTION

Figure 1:
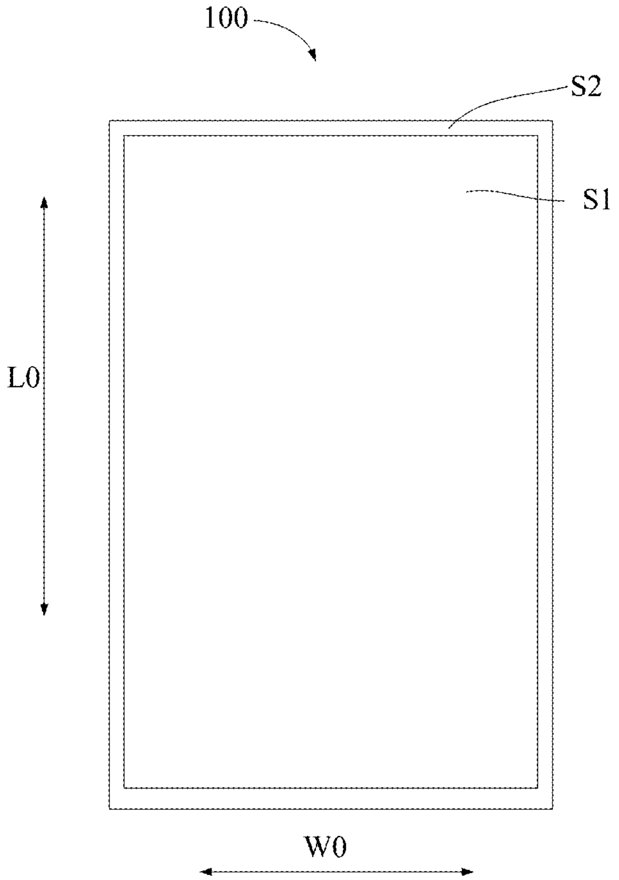
FIG. 1 is a schematic structural diagram of an electronic device shown according to an embodiment of the present disclosure.

Exemplary embodiments will be described in details herein, with examples thereof represented in the drawings. When the following descriptions involve the drawings, like numerals in different drawings represent like or similar elements unless otherwise indicated. Implementations described in the following exemplary embodiments do not represent all implementations consistent with the present disclosure. Rather, they are merely examples of apparatuses and methods consistent with some aspects of the present disclosure as detailed in the appended claims.

Terms used in the present disclosure are only for a purpose of describing specific embodiments, and are not intended to limit the present disclosure. Unless otherwise defined, technical terms or scientific terms used in the present disclosure should have usual meanings understood by persons with general skills in the field to which the present disclosure belongs. Terms such as "a" or "an" used in the specification and claims of the present disclosure also do not represent a limitation of quantity, but represents existence of at least one." "Multiple" represents two or more. Terms such as "including" or "containing" refer to that elements or objects appearing before "including" or "containing" include elements or objects appearing after "including" or "containing" and their equivalents, and do not exclude other elements or objects. Terms such as "connected" or "connecting" are not limited to physical or mechanical connections, but may include electrical connections, whether direct or indirect. Terms such as "above" and/or "below" are only for convenience of explanation and are not limited to a position or a spatial orientation. Singular forms, "a/an," "the," and "this," used in the specification and the appended claims of the present disclosure are also intended to include majority forms, unless the context clearly indicates other meanings. It should also be understood that the term "and/or" used herein refers to and includes any or all possible combinations of one or more related listed items.

The inventor/inventors has/have discovered through research that in an array substrate with a dual gate pixel structure, for two sub-pixel units in a sub-pixel region, one sub-pixel unit uses a longer connecting portion, to be connected to a corresponding thin film transistor, while the other sub-pixel unit uses a shorter connecting portion, to be connected to a corresponding thin film transistor. More additional lateral capacitance is generated between the longer connecting portion and a corresponding gate line, relative to the shorter connecting portion. The presence of the additional lateral capacitance affects the pixel voltage fluctuation when the gate voltage jumps, and easily leads to the appearance of the vertical lines.

To this end, the present disclosure provides an array substrate. The array substrate includes a plurality of sub-pixel regions arranged in an array, a gate line layer having a plurality of gate lines, and a common electrode layer. Each sub-pixel region of the sub-pixel regions has two sub-pixel units disposed in a same row and two thin film transistors correspondingly connected to the two sub-pixel units respectively. There is a gate line on each of two opposite sides of each row of sub-pixel regions. Control electrodes of two thin film transistors of each sub-pixel region are respectively connected to one of two gate lines located on two sides; and for two sub-pixel units of each of at least a part of the sub-pixel regions, one sub-pixel unit is connected to a first electrode of a corresponding thin film transistor through a longer first connecting portion, and the other sub-pixel unit is connected to a first electrode of a corresponding thin film transistor through a shorter second connecting portion. The first connecting portion is opposite to the gate line connected to the corresponding thin film transistor. The common electrode layer includes an electrode line body and a shielding portion connected to the electrode line body. The shielding portion is located above the first connecting portion and/or the shielding portion is located above the gate line connected to the thin film transistor corresponding to the first connecting portion. The above array substrate reduces or eliminates the capacitance between the longer first connecting portion and the corresponding gate line relative to the shorter second connecting portion, by disposing the common electrode layer to have the shielding portion located above the first connecting portion and/or above the gate line connected to the thin film transistor corresponding to the first connecting portion, and then reduces a voltage variation value caused by using connecting portions with different lengths to connect thin film transistors during the operation of the array substrate, thereby reducing the phenomenon of the vertical lines in the display screen having such an array substrate.

The array substrate mentioned in the present disclosure may be used to prepare a display panel, and may be applied in products or components with display functions such as mobile phones, tablet computers, televisions, notebook computers, and the like.

The array substrate, the display panel, and the electronic device provided by the present disclosure are described in detail below in combination with FIGS. 1-15.

Referring to FIG. 1, and when necessary, in combination with FIGS. 2-15, the present disclosure provides an electronic device 100 having a display panel. The display panel haves a display region S1 and a non-display region S2 at least located at a side of the display region S1. The display panel includes an array substrate and a cover plate laminated with the array substrate. The electronic device 100 has a width direction W0 and a length direction L0.

A portion, of the array substrate, located in the display region S1 has a pixel array. At least in the display region S1, the array substrate has a substrate layer (not shown), a gate line layer 10 located above the substrate layer, a first insulating layer 20 located above the gate line layer 10, a data line layer located above the first insulating layer 20, pixel electrodes 40 located above the data line layer, a second insulating layer 50 located above the pixel electrodes 40, and a common electrode layer 60 located above the second insulating layer 50. The gate line layer 10 includes a plurality of transversely extending gate lines 11 and gate electrodes 12 connected to the gate lines 11. The data line layer includes a plurality of longitudinally extending data lines 30.

Figure 2:
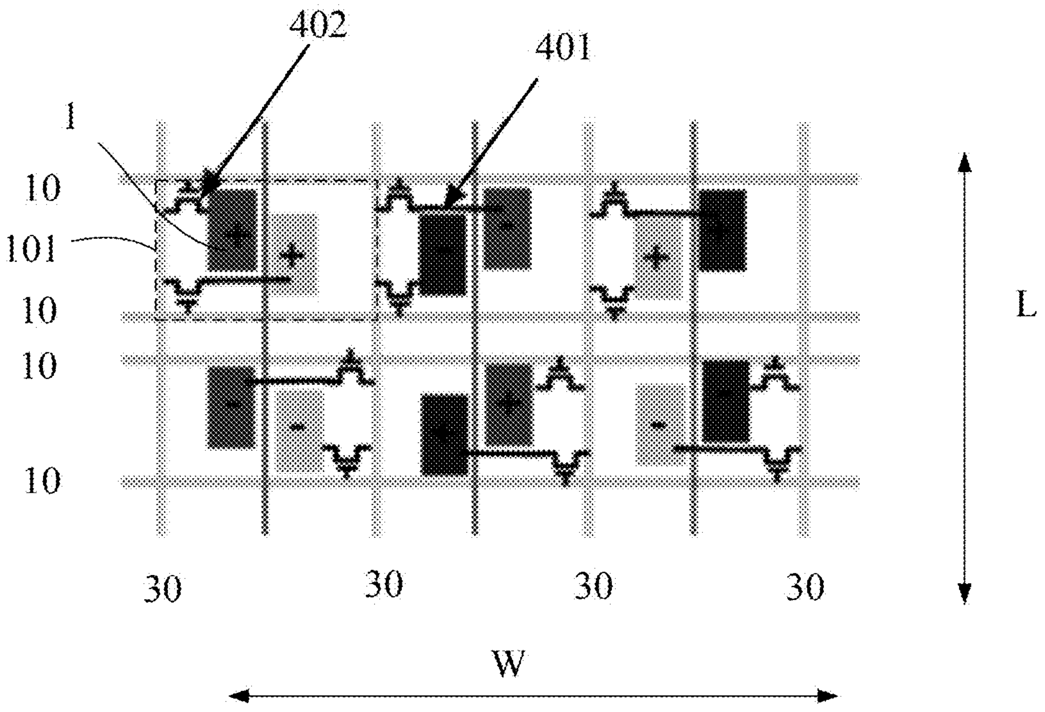
FIG. 2 is a partial schematic structural diagram of an array substrate shown according to an embodiment of the present disclosure.
Figure 3:
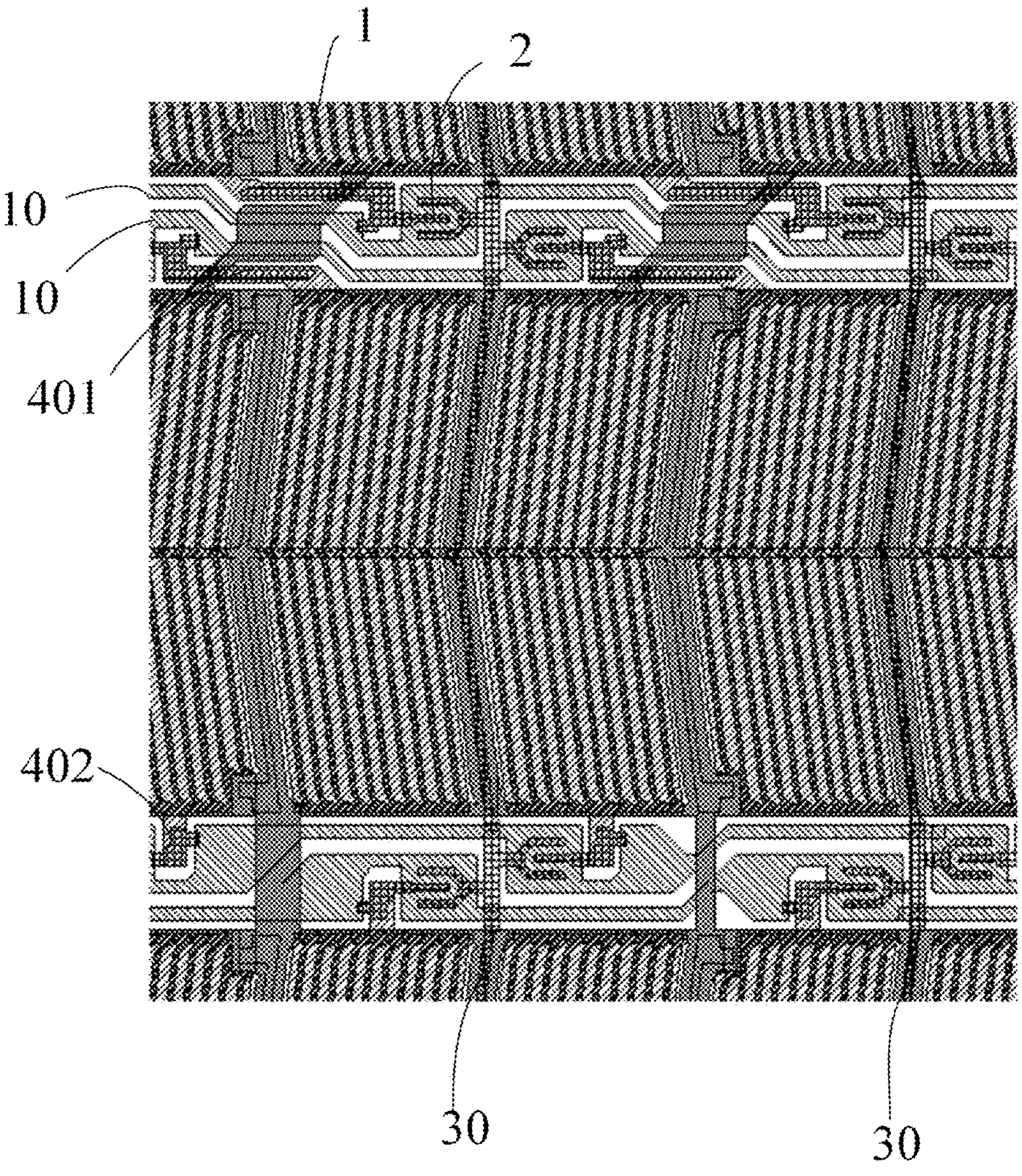
FIG. 3 is a partial schematic structural diagram of an array substrate shown according to an embodiment of the present disclosure.

In combination with FIG. 2, the array substrate includes a plurality of sub-pixel regions 101 arranged in an array. There is a column of sub-pixel regions 101 between two adjacent data lines 30. There are two gate lines 11 between two adjacent rows of sub-pixel regions 101.

Each sub-pixel region 101 has two sub-pixel units 1 disposed in a same row and two thin film transistors 2 correspondingly connected to the two sub-pixel units 1 respectively. It can be understood that, generally, each thin film transistor 2 is in opposite to a gate electrode 12. That is, orthographic projections of the thin film transistor 2 and the opposite gate electrode 12 in a thickness direction T of the array substrate overlap at least partially.

Figure 4:
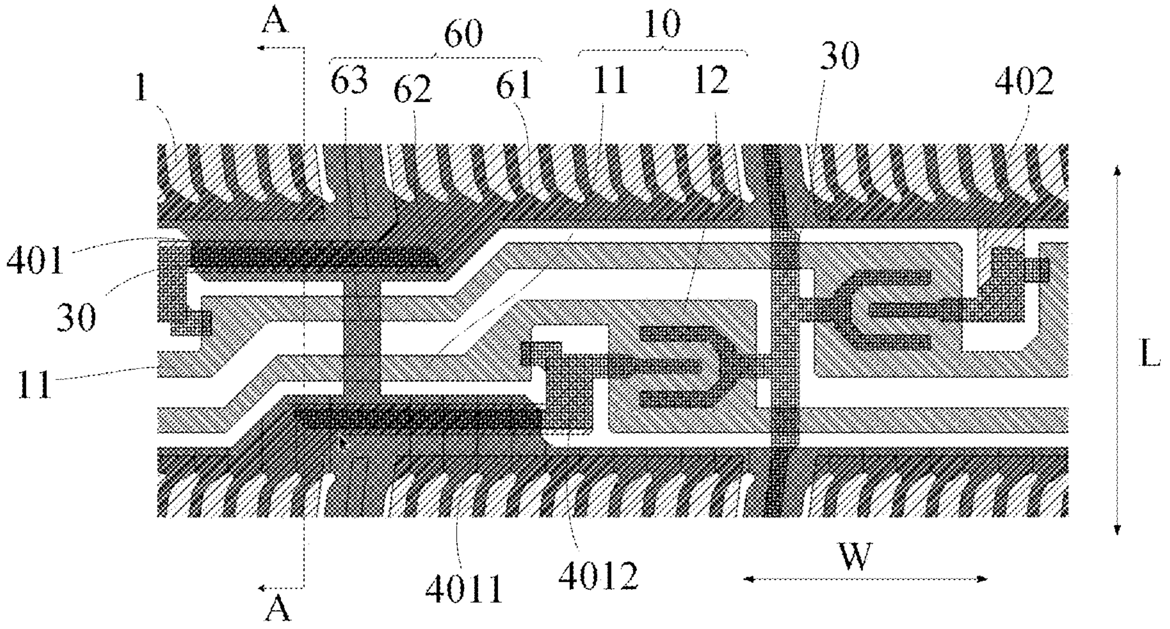
FIG. 4 is a partial schematic structural diagram of another array substrate shown according to an embodiment of the present disclosure.
Figure 5:
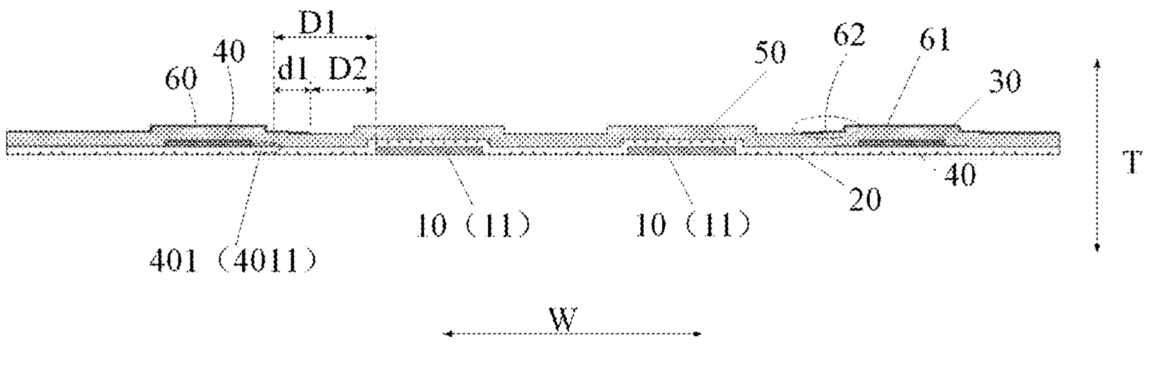
FIG. 5 is a section view of the structure shown in FIG. 4.

There is a gate line 11 on each of two opposite sides of each row of sub-pixel regions 101. Control electrodes of the two thin film transistors 2 of each sub-pixel region 101 are respectively connected to the two gate lines 11 located on the two sides of the sub-pixel region 101 through gate electrodes 12 respectively corresponding to the control electrodes. Moreover, for two sub-pixel units 1 of each of at least a part of the sub-pixel regions 101, one sub-pixel unit is connected to a first electrode of a corresponding thin film transistor 2 through a longer first connecting portion 401, and the other sub-pixel unit is connected to a first electrode of a corresponding thin film transistor 2 through a shorter second connecting portion 402. An extending direction of the first connecting portion 401 is consistent with an extending direction of the gate line 11 connected to the corresponding thin film transistor 2. The common electrode layer 60 includes an electrode line body 61 and a shielding portion 62 connected to the electrode line body 61. In some embodiments, the shielding portion 62 is located above the first connecting portion 401, as shown in FIGS. 4 and 5, for example.

The first connecting portion 401 has a connecting body 4011 extending in a transverse direction W and a connecting end portion 4012 that is connected to the connecting body 4011 and the first electrode of the thin film transistor 2 and extends in a longitudinal direction L. The second connecting portion 402 extends longitudinally. The shielding portion 62 is located above the connecting body 4011.

Accordingly, the extending direction of the first connecting portion 401 being consistent with the extending direction of the gate line 11 connected to the corresponding thin film transistor 2, may be understood as the extending direction of the connecting body 4011 of the first connecting portion 401 being consistent with the extending direction of the gate line 11 connected to the corresponding thin film transistor 2.

The shielding portion 62 being located above the connecting body 4011 here, may be understood as the shielding portion 62 being located directly above the connecting body 4011. The shielding portion 62 covers an entire region directly above the connecting body 4011 here. Of course, in some other embodiments, the shielding portion 62 may alternatively cover a part of the region directly above the connecting body 4011.

Furthermore, to better shield the lateral capacitance between the gate line and the first connecting portion, an outer edge, towards the corresponding gate line, of the shielding portion also may extend out of a region directly above the first connecting portion.

In combination with FIGS. 4 and 5, in some embodiments, an edge of an orthographic projection of the shielding portion 62 in a thickness direction T of the array substrate is closer to the corresponding gate line 11, than an edge of an orthographic projection of the connecting body 4011 in the thickness direction T of the array substrate. That is, the outer edge, towards the corresponding gate line 11, of the shielding portion 62 also extends out of the region directly above the first connecting portion 401, to better shield charges between the first connecting portion 401 and the gate line, and reduce the capacitance between the first connecting portion 401 and the gate line.

In some embodiments, the edge of the orthographic projection of the shielding portion 62 in the thickness direction T of the array substrate is apart from the corresponding gate line 11 by a third distance D2; the edge of the orthographic projection of the connecting body 4011 in the thickness direction T of the array substrate is apart from the corresponding gate line 11 by a fourth distance D1; and a difference between the third distance D2 and the fourth distance D1 is d1. A dimension of d1 is 3 μm-5 μm, to better shield the charges between the first connecting portion 401 and the gate line and reduce the capacitance between the first connecting portion 401 and the gate line, while the dimension of the shielding portion 62 is controlled to reduce adverse effects on other structures caused by introduction of the shielding portion 62.

In a same column of sub-pixel regions 101, respective first connecting portions 401 of at least one set of two adjacent rows of sub-pixel regions 101 that are located on two sides of two adjacent rows of gate lines 11, are disposed opposite to each other. There is a connecting portion 63 between shielding portions 62 above the two opposite first connecting portions 401. It can be understood that, in some other embodiments, in the same column of sub-pixel regions, for at least one set of two adjacent rows of sub-pixel regions located on two sides of two adjacent rows of gate lines, a first connecting portion of one sub-pixel region and a second connecting portion of the other sub-pixel region are disposed opposite to each other.

In combination with FIGS. 6-13, in some other embodiments, the shielding portion 62 may be located above the gate line 11 connected to the thin film transistor 2 corresponding to the first connecting portion 401.

The thin film transistor 2 corresponding to the first connecting portion 401 here can be understood as the thin film transistor 2 connected to the first connecting portion 401. Accordingly, the first connecting portion 401 may be connected to the first electrode of the thin film transistor 2. Here, the first electrode of the thin film transistor may be a drain electrode. Of course, in some other embodiments, the first electrode may also be a source electrode.

The gate line 11 connected to the thin film transistor 2 corresponding to the first connecting portion 401 can be understood as the gate line 11 that is also connected to the same thin film transistor 2 together with the first connecting portion 401. The gate line 11 is connected to the control electrode (that is, a gate electrode) of the thin film transistor 2.

In embodiments shown in FIGS. 6-13, in a same column of sub-pixel regions 101, respective first connecting portions 401 of at least one set of two adjacent rows of sub-pixel regions 101 that are located on two sides of two adjacent rows of gate lines 11, are disposed opposite to each other. It can be understood that, in some other embodiments, for two adjacent rows of sub-pixel regions located on two sides of two adjacent rows of gate lines, a first connecting portion of one sub-pixel region and a second connecting portion of the other sub-pixel region are disposed opposite to each other. Accordingly, the shielding portion is disposed above the gate line corresponding to the first connecting portion.

Continuing to combine with FIGS. 6-13, in some embodiments, the shielding portion 62 is disposed above the two gate lines 11 between the respective first connecting portions 401 of the two adjacent rows of sub-pixel regions 101.

The shielding portion 62 includes a first portion 621 located above one of the gate lines 11 between the respective first connecting portions 401 of the two adjacent rows of sub-pixel regions 101, and a second portion 622 located above the other one of the gate lines 11 between the respective first connecting portions 401 of the two adjacent rows of sub-pixel regions 101, respectively.

In some embodiments, a connecting portion 623 may also be disposed between the first portion 621 and the second portion 622.

Figure 6:
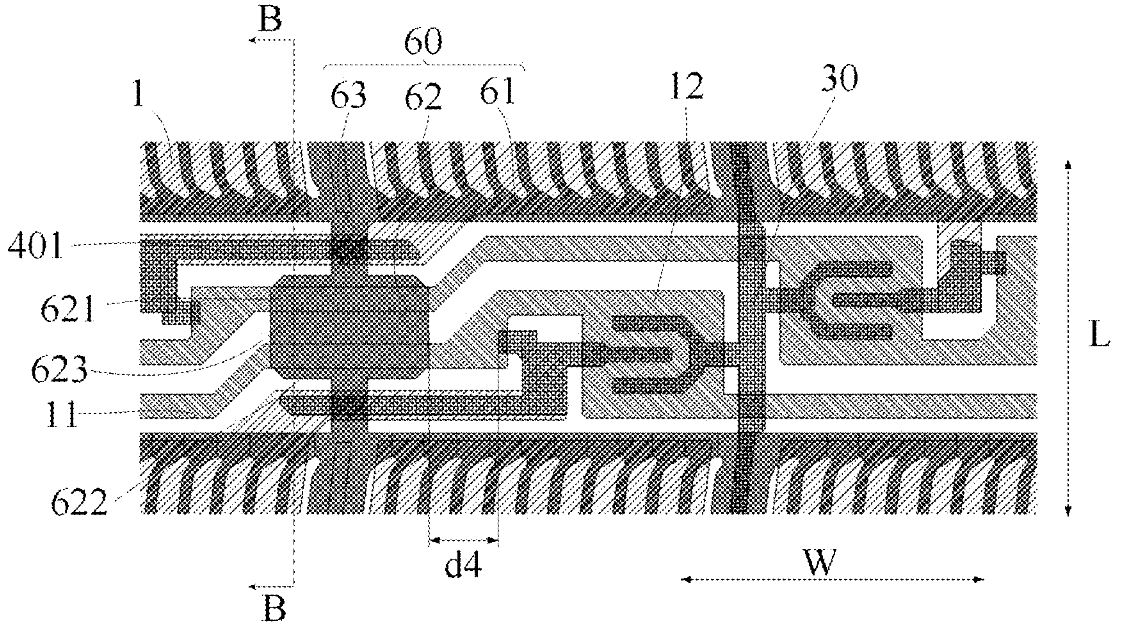
FIG. 6 is a partial schematic structural diagram of another array substrate shown according to an embodiment of the present disclosure.
Figure 7:
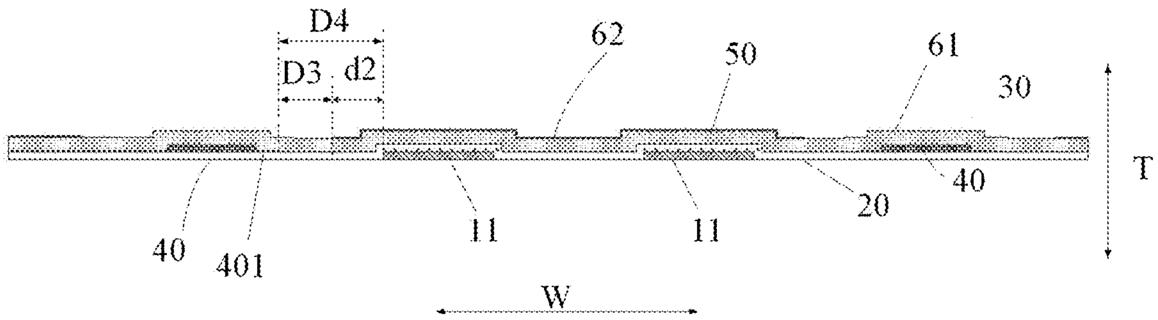
FIG. 7 is a section view of the structure shown in FIG. 6.
Figure 8:
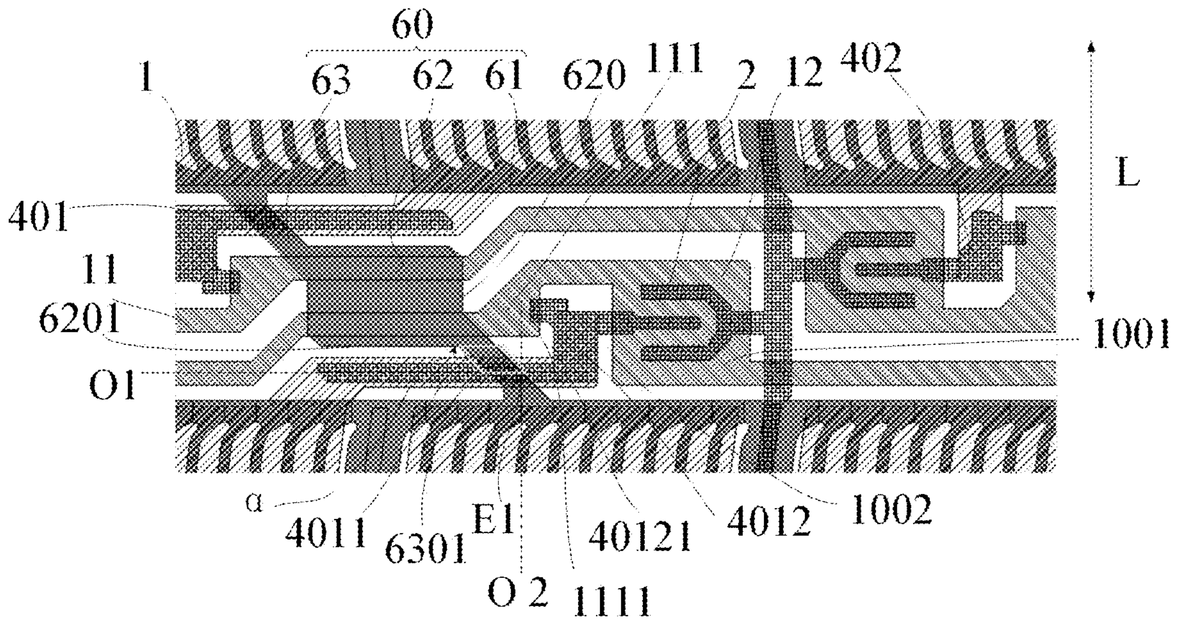
FIG. 8 is a partial schematic structural diagram of still another array substrate shown according to an embodiment of the present disclosure.

In combination with FIGS. 6-8, in some embodiments, a dimension, in the transverse direction W, of the connecting portion 623 is consistent with dimensions, in the transverse direction W, of the first portion 621 and the second portion 622, such that the shielding portion 62 forms a continuous shielding region located above the two opposite first connecting portions 401.

Similarly, to better shield the lateral capacitance between the gate line and the first connecting portion, a side, towards the first connecting portion, of the shielding portion may extend out of a region directly above the corresponding gate line.

In combination with FIG. 7, in some embodiments, the edge of the orthographic projection of the shielding portion 62 on the array substrate is closer to the first connecting portion 401, than an edge of an orthographic projection of the gate line 11 in the thickness direction T of the array substrate. That is, the side, towards the first connecting portion, of the shielding portion extends out of the region directly above the corresponding gate line, to better shield the charges between the first connecting portion 401 and the gate line 11, and reduce the capacitance between the first connecting portion 401 and the gate line 11.

In some embodiments, the edge of the orthographic projection of the shielding portion 62 in the thickness direction T of the array substrate is apart from the first connecting portion 401 by a first distance D3; the edge of the orthographic projection of the gate line 11 in the thickness direction T of the array substrate is apart from the first connecting portion 401 by a second distance D4; and a difference between the first distance D3 and the second distance D4 is d2. Here, d2 may be set as 1.5 μm-3 μm.

Figure 9:
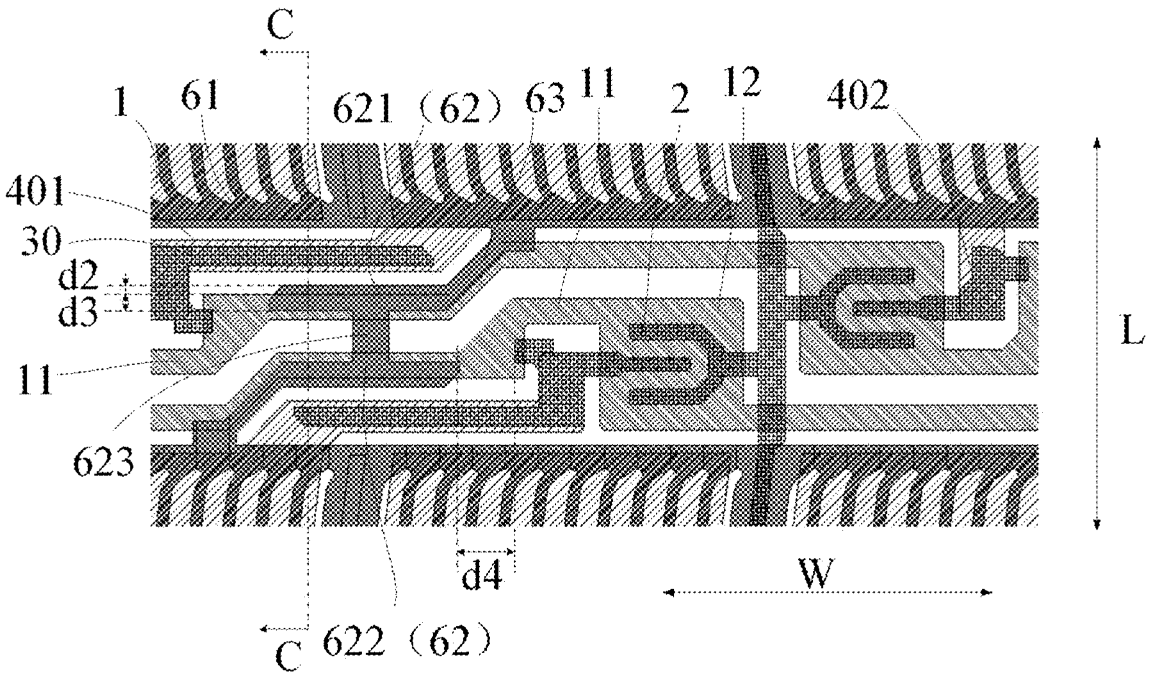
FIG. 9 is a partial schematic structural diagram of still another array substrate shown according to an embodiment of the present disclosure.
Figure 10:
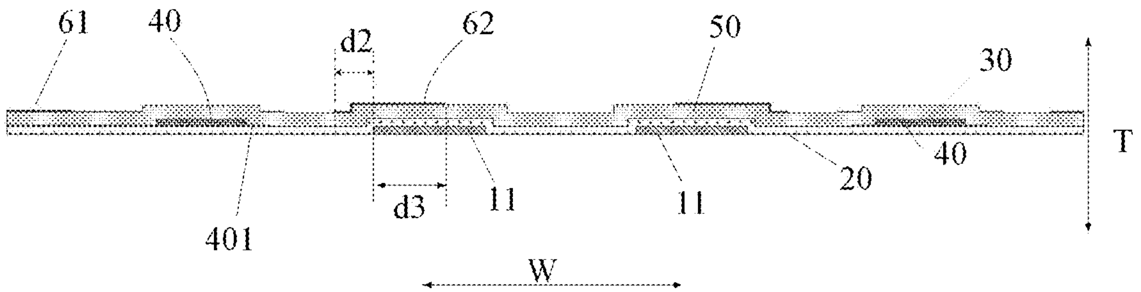
FIG. 10 is a section view of the structure shown in FIG. 9.
Figure 11:
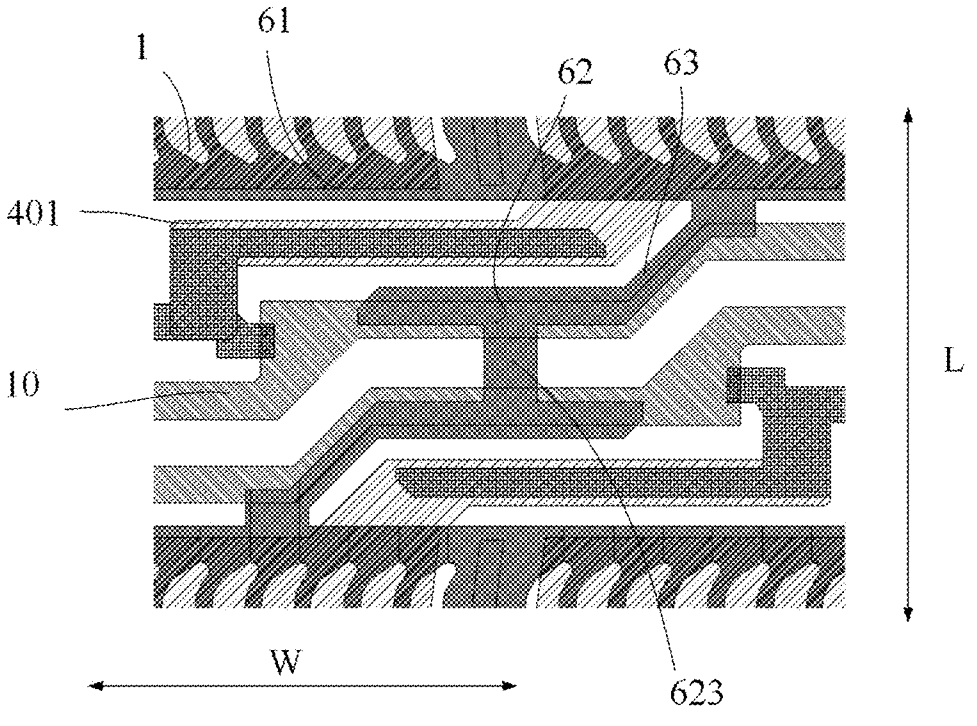
FIG. 11 is a schematic enlarged diagram of a partial structure shown in FIG. 9.

In combination with FIGS. 9-11, the dimension, in the transverse direction W, of the connecting portion 623 is significantly smaller than the dimensions, in the transverse direction W, of the first portion 621 and the second portion 622. Compared to the above implementations shown in FIGS. 6-8, in this implementation, while shielding the charges between the first connecting portion 401 and the gate line 11, the dimension of the shielding portion can be reduced, and the effect of the shielding portion 62 on other structures can be reduced, especially an electrical effect.

In some embodiments, for the dimension, in the transverse direction W, of the connecting portion 623 significantly smaller than the dimensions, in the transverse direction W, of the first portion 621 and the second portion 622, an overlap width d3, in the longitudinal direction L, between the shielding portion 62 and the corresponding gate line 11 is 2.5 μm-3.5 μm, which is advantageous for, while better ensuring the shielding of the lateral capacitance between the gate line 11 and the first connecting portion 401, further reducing the dimension of the shielding portion to further reduce the effect of the shielding portion 62 on other structures.

It can be understood that in the embodiments shown in FIGS. 9-11, to better shield the lateral capacitance between the gate line and the first connecting portion, the side, towards the first connecting portion, of the shielding portion may extend out of the region directly above the corresponding gate line. A portion, extending out of the region, of the shielding portion 62 is similar to a portion extending out of the region in the embodiments shown in FIGS. 6-8, which may refer to the relevant description above and will not be repeated here.

In combination with FIGS. 6-13, in some embodiments, there is a third connecting portion 63 between the shielding portion 62 and the electrode line body 61.

In combination with FIG. 6, in some embodiments, the third connecting portion 63 extends in the longitudinal direction L, to connect the shielding portion 62 to the electrode line body 61.

In combination with FIGS. 8-13, in some other embodiments, the third connecting portion 63 is inclined.

In some embodiments, the third connecting portion 63 is inclined towards a side where the corresponding thin film transistor 2 is located. Specifically, an end, away from the shielding portion 62, of the third connecting portion 63 is inclined towards a side where the corresponding thin film transistor 2 is located.

Figure 12:
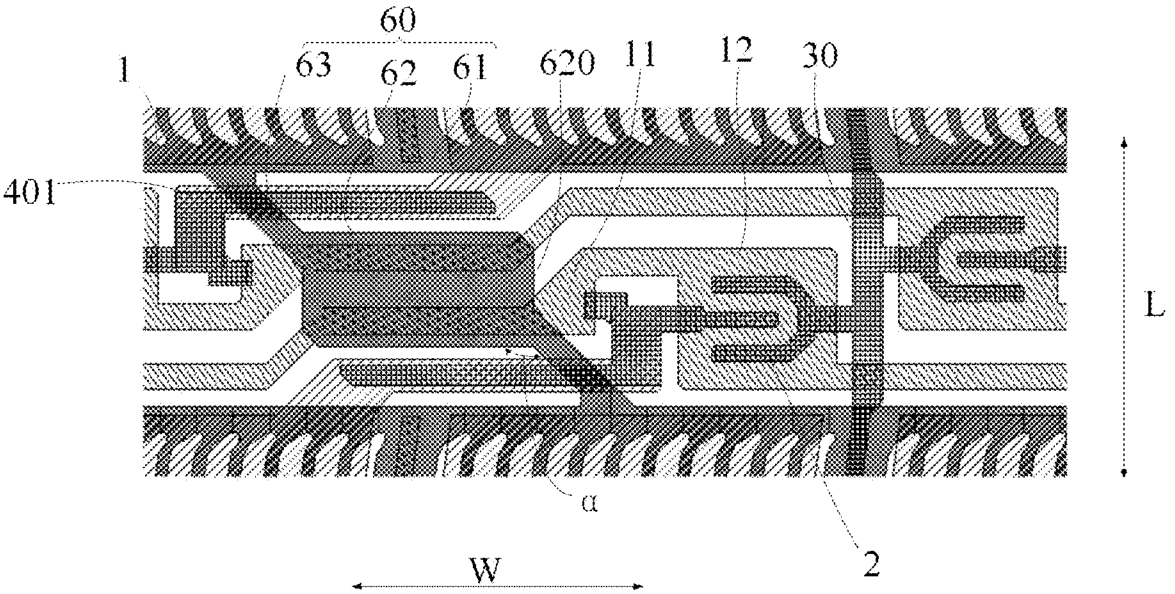
FIG. 12 is a partial schematic structural diagram of still another array substrate shown according to an embodiment of the present disclosure.

In combination with FIGS. 8 and 12, in some embodiments, an angle α between the third connecting portion 63 and a transversely extending side 6201 of the shielding portion 62, is greater than 90 degrees and less than 180 degrees.

An end, towards the electrode line body 61, of the third connecting portion 63, may extend beyond a side edge, in the width direction W, of the shielding portion 62, such that a portion extending beyond the side edge 620 of the shielding portion 62 can also have a certain effect of shielding of the charges.

In combination with FIG. 8, in an embodiment, the gate line 11 corresponding to the third connecting portion 63 has a bent portion 111 corresponding to the corresponding thin film transistor 2, and the bent portion 111 has an edge portion 1111 facing the corresponding thin film transistor 2. A portion of the third connecting portion 63 located on a side, close to the shielding portion 62, of a transverse centerline O1 of the first connecting portion 401 is located on a side, away from the thin film transistor 2, of the edge portion 1111. Of course, the portion of the third connecting portion 63 located on the side, close to the shielding portion 62, of the transverse centerline O1 of the first connecting portion 401 may also be aligned with the edge portion 1111.

Based on the fact that the portion of the third connecting portion 63 located on the side, close to the shielding portion 62, of the transverse centerline O1 of the first connecting portion 401 exhibits a relatively obvious shielding effect on the lateral capacitance between the first connecting portion 401 and the corresponding gate line 11, and the other parts of the third connecting portion 63 exhibits a non-obvious shielding effect on the lateral capacitance between the first connecting portion 401 and the corresponding gate line 11, the portion of the third connecting portion 63 located on the side, close to the shielding portion 62, of the transverse centerline O1 of the first connecting portion 401 may be considered as an effective shielding portion beyond/out of the shielding portion 62. Thus, the effective shielding portion, out of the shielding portion 62, of the third connecting portion 63 may not go beyond/exceed the edge portion 1111, to prevent mutual interference between the effective shielding portion of the third connecting portion 63 and the opposite thin film transistor 2.

It can be understood that, in some other embodiments, the portion of the third connecting portion 63 located on the side, close to the shielding portion 62, of the transverse centerline O1 of the first connecting portion 401 is aligned with the edge portion 1111, and has a better shielding effect.

Figure 13:
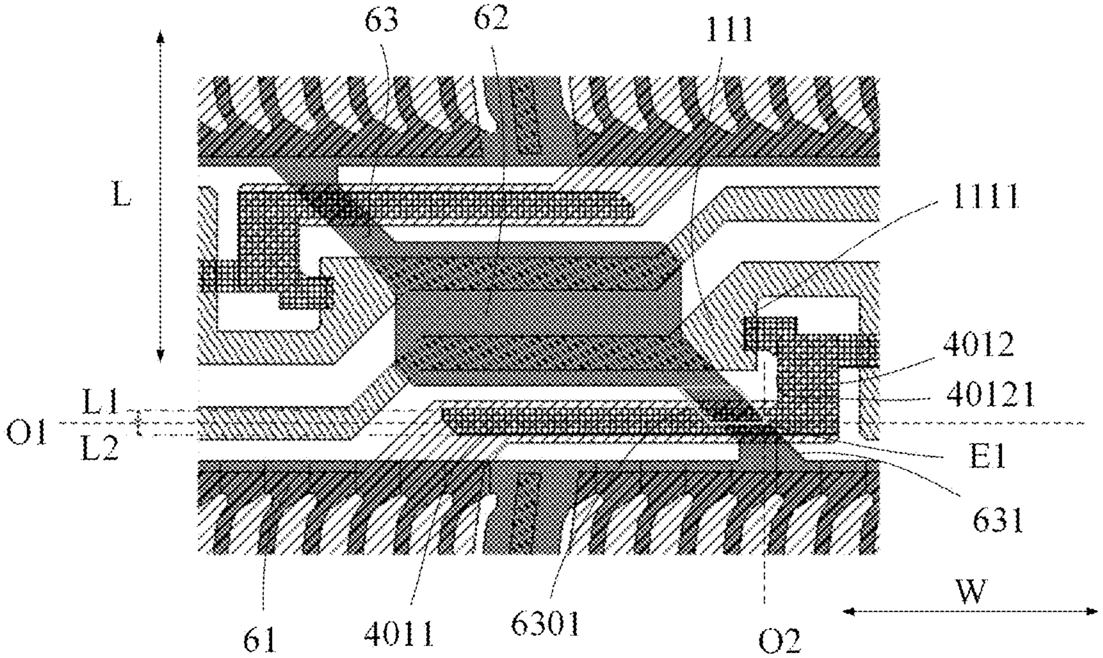
FIG. 13 is a schematic enlarged diagram of a partial structure shown in FIG. 12.

In combination with FIG. 8, as well as FIGS. 12-13, the portion of the third connecting portion 63 located on the side, close to the shielding portion 62, of the transverse centerline O1 of the first connecting portion 401 here is a portion, located in a diamond-shaped region indicated by 6301, of the third connecting portion 63 in FIGS. 8 and 13. The case that the portion of the third connecting portion 63 located on the side, close to the shielding portion 62, of the transverse centerline O1 of the first connecting portion 401 may be or may be not aligned with the edge portion 1111 here may be understood as that the crossover point (that is, a position of a point E1) of a side, close to the gate electrode 12, of the third connecting portion 63 and the transverse centerline O1 of the first connecting portion 401 may be or may be not aligned with the edge portion 1111 in a vertical direction O2 (i.e., the direction L). The case that the portion of the third connecting portion 63 located on the side, close to the shielding portion 62, of the transverse centerline O1 of the first connecting portion 401 may be or may be not aligned with the edge portion 1111 here may be understood as that the crossover point (that is, the position of a point E1) of a side 631, close to the gate electrode 12, of the third connecting portion 63 and the transverse centerline O1 of the first connecting portion 401 may be or may be not aligned with the edge portion 1111 in the vertical direction L (in FIGS. 8 and 13, the crossover point is not aligned with the edge portion 1111; in FIG. 12, the crossover point is aligned with the edge portion 1111).

It can be understood that, in some embodiments, the gate line 11 has an avoidance notch 1002 on a side, where the first electrode of the thin film transistor 2 is located, of the gate electrode 12, such that an connecting end 4012 of the first connecting portion 401 extends into the avoidance notch 1002 and is connected to the first electrode. The edge portion 1111 can be understood as a side edge at a side, away from the gate electrode, of the avoidance notch 1002.

In combination with FIGS. 12-13, in some embodiments, a connecting end portion 4012 extends in the longitudinal direction L. The first connecting portion 401 has a connecting body 4011 extending in the transverse direction W and the connecting end portion 4012 that is connected to the connecting body 4011 and the first electrode of the thin film transistor 2 and extends in the longitudinal direction L. The connecting end portion 4012 has a side edge 40121 at a side away from the thin film transistor 2. The portion of the third connecting portion 63 located on the side, close to the shielding portion 62, of the transverse centerline O1 of the first connecting portion 401 is located on a side, away from the thin film transistor 2, of the side edge 40121. Thus, the effective shielding portion, beyond/out of the shielding portion 62, of the third connecting portion 63 may not exceed the edge portion 1111, to prevent mutual interference between the third connecting portion 63 and the opposite thin film transistor 2.

Of course, in some other embodiments, the portion of the third connecting portion 63 located on the side, close to the shielding portion 62, of the transverse centerline O1 of the first connecting portion 401 may also be aligned with the side edge. It can be understood that, the portion of the third connecting portion 63 located on the side, close to the shielding portion 62, of the transverse centerline O1 of the first connecting portion 401 here being aligned with the side edge 40121 in the transverse direction W has a better shielding effect.

In combination with FIGS. 12 and 13, the portion of the third connecting portion 63 located on the side, close to the shielding portion 62, of the transverse centerline O1 of the first connecting portion 401 here is a portion, located in the diamond-shaped region indicated by 6301, of the third connecting portion 63 in FIG. 13. The case that the portion of the third connecting portion 63 located on the side, close to the shielding portion 62, of the transverse centerline O1 of the first connecting portion 401 may also be or be not aligned with the side edge 40121 here, which may be understood as that the crossover point (that is, the position of the point E1) of a side 631, close to the gate electrode 12, of the third connecting portion 63 and the transverse centerline O1 of the first connecting portion 401 may be or may be not aligned with the side edge 40121 in the vertical direction O2 (i.e., the direction L). Distances L1 and L2 between the transverse centerline O1 of the first connecting portion 401 and two longitudinally opposite sides of the first connecting portion 401 are equal here. In some embodiments, the orthographic projection of the shielding portion 62 in the thickness direction T of the array substrate is spaced by 2 micrometers or more from the corresponding thin film transistor 2, to avoid the mutual interference between the shielding portion 62 and the corresponding thin film transistor 2.

For example, as shown in FIGS. 6 and 9, spacing distances between an edge of the orthographic projection of the shielding portion 62 in the thickness direction T of the array substrate and the corresponding thin film transistors 2 are d4. d4 should be 2 micrometers or more.

Similarly, for the case where the shielding portion 62 is located above the first connecting portion 401, an edge of an orthographic projection region of the shielding portion 62 in the thickness direction T of the array substrate is also spaced by 2 micrometers or more from the corresponding thin film transistor 2.

In some embodiments, the thickness of the gate line 11 ranges from 0.4 micrometers to 0.5 micrometers. For example, the thickness of the gate line 11 may be set to 0.45 micrometers or thicker, to reduce the resistance of the gate line 11, and thereby reduce the adverse effects on the gate line 11 caused by the disposing of the shielding portion 62.

Figure 14:
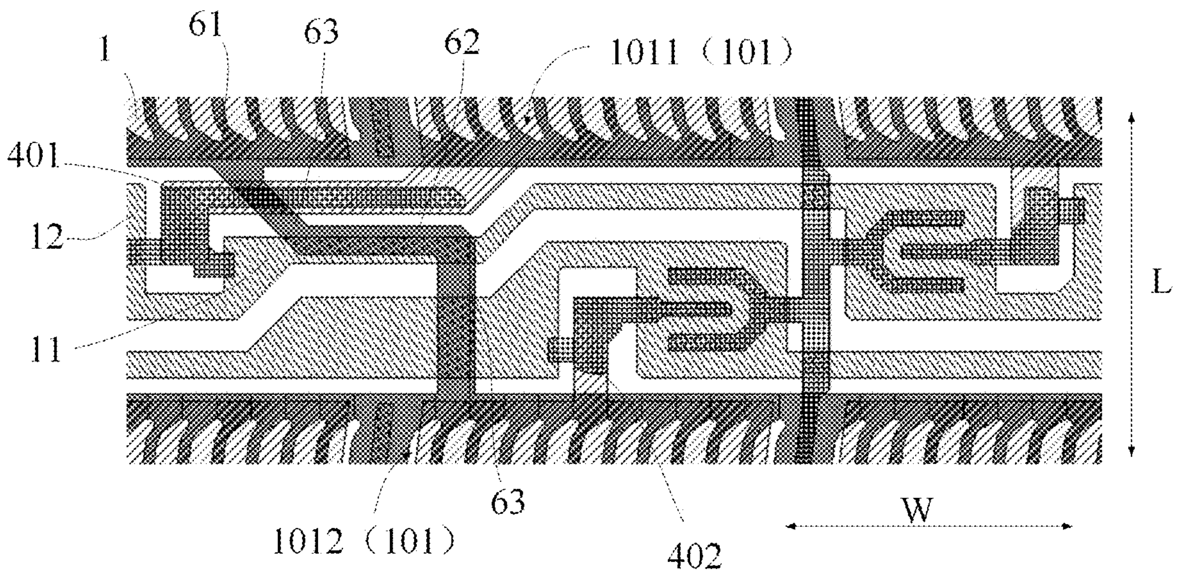
FIG. 14 is a partial schematic structural diagram of yet another array substrate shown according to an embodiment of the present disclosure.
Figure 15:
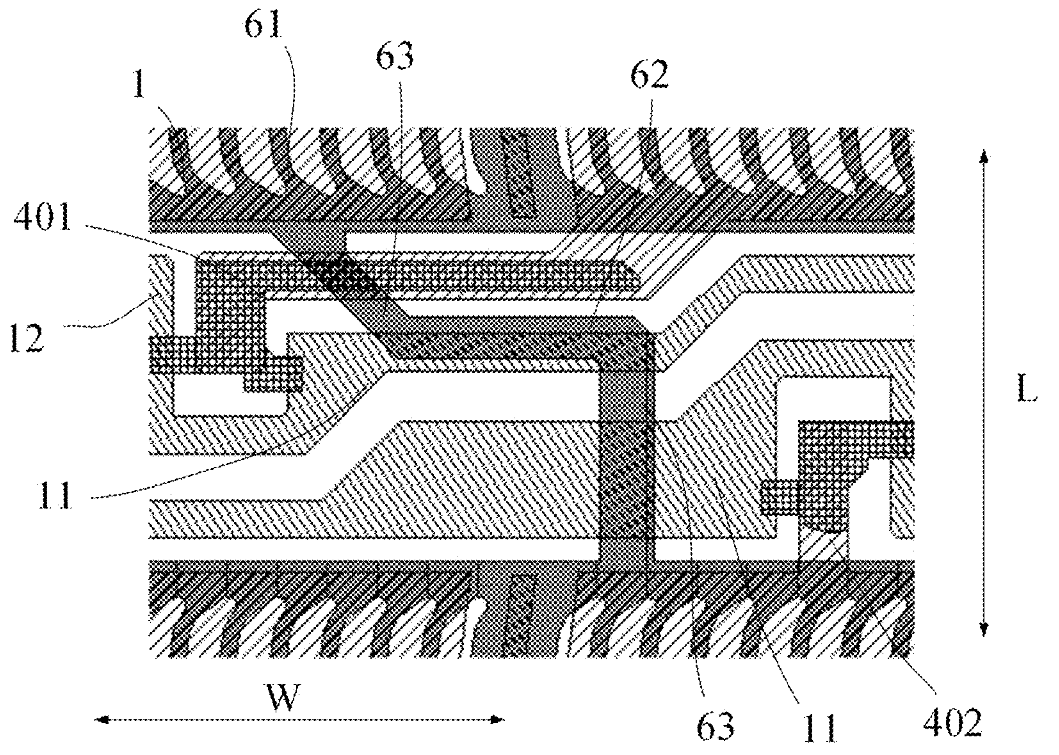
FIG. 15 is a schematic enlarged diagram of a partial structure shown in FIG. 14.

In the above embodiments in FIGS. 6-13, in a same column of sub-pixel regions 101, respective first connecting portions 401 of at least one set of two adjacent rows of sub-pixel regions 101 that are located on two sides of two adjacent rows of gate lines 11, are disposed opposite to each other. It can be understood that, in some other embodiments, in the same column of sub-pixel regions, in at least one set of two adjacent sub-pixel regions located on two sides of two adjacent rows of gate lines, a first connecting portion of one sub-pixel region and a second connecting portion of the other sub-pixel region are disposed opposite to each other. For example, as shown in FIGS. 14 and 15, in the same column of sub-pixel regions, there is a set of two adjacent sub-pixel regions 1011 and 1012, located on two sides of two adjacent rows of gate lines 11. In the drawings, a sub-pixel unit located in the sub-pixel region 1011 is connected to the corresponding thin film transistor through the longer first connecting portion 401, and a sub-pixel unit located in the sub-pixel region 1012 is connected to the corresponding thin film transistor through the shorter second connecting portion 402. The first connecting portion 401 in the sub-pixel region 1011 is disposed opposite to the second connecting portion 402 in the sub-pixel region 1012. Correspondingly, the shielding portion 62 is disposed above the above gate line 11. The shielding portion 62 is connected to a common electrode line body 61 of the sub-pixel region 1012 through a longer connecting portion 63.

It can be understood that for the implementations that the shielding portion 62 is disposed above the first connecting portion 401, the manner in which the first connecting portion of one sub-pixel region and the second connecting portion of the other sub-pixel region of the two adjacent sub-pixel regions are disposed opposite to each other, may be similar to the disposing manner in FIGS. 14 and 15.

It should be noted that in the above some embodiments, the shielding portion 62 is located above the first connecting portion 401. In some other embodiments above, the shielding portion 62 is located above the gate line 11 connected to the thin film transistor 2 corresponding to the first connecting portion 401. Of course, in some other embodiments, the shielding portion may also include both a portion located above the first connecting portion, and a portion located above the gate line that is connected to the thin film transistor corresponding to the first connecting portion.

It should also be noted that the above transverse direction W may be parallel or substantially parallel to the width direction W0 of the electronic device 100, and the longitudinal direction L may be parallel or substantially parallel to the length direction L0 of the electronic device. The thickness direction T may be understood correspondingly as the thickness direction of the electronic device 100. Of course, the transverse direction W may alternatively be parallel or substantially parallel to the length direction L0 of the electronic device, and the longitudinal direction L may alternatively be parallel or substantially parallel to the width direction W0 of the electronic device 100.

Based on the above description of the array substrate, the inventor/inventors has/have conducted extensive experiments and found that the introduction of the shielding portion 62 may effectively reduce the difference (i.e., the additional lateral capacitance) in the capacitances between the longer first connecting portion 401 as well as the shorter second connecting portion 402 and the corresponding gate lines 11, such that a corresponding additional lateral capacitance of an individual sub-pixel is reduced to 0.77 fF. Then, when the gate voltage jumps, a value of the pixel voltage fluctuation is controlled within 0.02V, or even to 0.01V, thus effectively eliminating the phenomenon of the vertical lines.

In the present disclosure, the terms "first" and "second" are used solely for descriptive purposes and should not be understood as indicating or implying relative importance. The terms "multiple" and "several" refer to two or more, unless explicitly defined otherwise.

Those skilled in the art will easily come up with other implementation solutions of the present disclosure after considering the specification and practicing the disclosure disclosed herein. The present disclosure aims to cover any variations, uses, or adaptive changes of the present disclosure, which follow general principles of the present disclosure and include common knowledge or customary technical means in the art not disclosed in the present disclosure. The specification and embodiments are only considered exemplary, and the true scope and spirit of the present disclosure are indicated by the following claims.

It should be understood that the present disclosure is not limited to the precise structure described above and shown in the drawings, and various modifications and changes may be made without departing from its scope. The scope of the present disclosure is limited only by the appended claims.

The invention claimed is:

1. An array substrate, comprising:

a plurality of sub-pixel regions arranged in an array, wherein each sub-pixel region of the sub-pixel regions has two sub-pixel units side by side and two thin film transistors connected to the two sub-pixel units respectively;

a gate line layer, comprising gate lines and gate electrodes connected to the gate lines and opposite to the thin film transistors; wherein there is a gate line on each of two opposite ends of each row of sub-pixel regions; wherein control electrodes of the two thin film transistors of the each sub-pixel region are respectively connected to two gate lines located on two ends of the sub-pixel region through gate electrodes respectively corresponding to the control electrodes; and, wherein for two sub-pixel units of each of at least a part of the sub-pixel regions, one sub-pixel unit is connected to a first electrode of a corresponding thin film transistor through a first connecting portion, and other sub-pixel unit is connected to a first electrode of a corresponding thin film transistor through a second connecting portion; wherein an extending direction of the first connecting portion is consistent with an extending direction of a gate line connected to the corresponding thin film transistor; and a common electrode layer, comprising an electrode line body and a shielding portion connected to the electrode line body, wherein the shielding portion is located above the first connecting portion and/or the shielding portion is located above the gate line connected to the thin film transistor corresponding to the first connecting portion.

2. The array substrate of claim 1, wherein the array substrate has a plurality of data lines; there is a column of sub-pixel regions between two adjacent data lines; there are two gate lines between two adjacent rows of sub-pixel regions; in a same column of sub-pixel regions, respective first connecting portions of at least one set of two adjacent rows of sub-pixel regions are disposed opposite to each other; the shielding portion is disposed above the two gate lines between the respective first connecting portions of the two adjacent rows of sub-pixel regions.

3. The array substrate of claim 2, wherein the shielding portion comprises a first portion located above one of the gate lines between the respective first connecting portions of the two adjacent rows of sub-pixel regions, and a second portion located above other one of the gate lines between the respective first connecting portions of the two adjacent rows of sub-pixel regions, respectively.

4. The array substrate of claim 3, wherein a connecting portion is disposed between the first portion and the second portion.

5. The array substrate of claim 4, wherein a dimension, in a transverse direction, of the connecting portion is consistent with dimensions, in the transverse direction, of the first portion and the second portion.

6. The array substrate of claim 2, wherein for the shielding portion located above the gate line connected to the thin film transistor corresponding to the first connecting portion, an edge of an orthographic projection of the shielding portion on the array substrate is closer to the first connecting portion, than an edge of an orthographic projection of the gate line on the array substrate.

7. The array substrate of claim 6, wherein the edge of the orthographic projection of the shielding portion on the array substrate is apart from the first connecting portion by a first distance; the edge of the orthographic projection of the gate line on the array substrate is apart from the first connecting portion by a second distance; and a difference between the first distance and the second distance is 1.5 μm-3 μm.

8. The array substrate of claim 6, wherein an overlap width, in a longitudinal direction, between the shielding portion and a corresponding gate line is 2.5 μm-3.5 μm.

9. The array substrate of claim 2, wherein there is a third connecting portion between the shielding portion and the electrode line body.

10. The array substrate of claim 9, wherein the third connecting portion is inclined.

11. The array substrate of claim 10, wherein an end, away from the shielding portion, of the third connecting portion is inclined towards a side where the corresponding thin film transistor is located.

12. The array substrate of claim 11, wherein an angle between the third connecting portion and a transversely extending side of the shielding portion, is greater than 90 degrees and less than 180 degrees.

13. The array substrate of claim 11, wherein a gate line corresponding to the third connecting portion has an avoidance notch on a side, where the first electrode of the thin film transistor is located, of a corresponding gate electrode; the avoidance notch has an edge portion away from the gate electrode;

a portion of the third connecting portion located on a side, close to the shielding portion, of a transverse centerline of the first connecting portion is located on a side, away from the thin film transistor, of the edge portion; or, the portion of the third connecting portion located on the side, close to the shielding portion, of the transverse centerline of the first connecting portion is aligned with the edge portion.

14. The array substrate of claim 11, wherein the first connecting portion has a connecting body extending in a transverse direction and a connecting end portion that is connected to the connecting body and the first electrode of the thin film transistor and extends in a longitudinal direction; the connecting end portion has a side edge away from the thin film transistor;

a portion of the third connecting portion located on a side, close to the shielding portion, of a transverse centerline of the first connecting portion is located on a side, away from the thin film transistor, of the side edge; or, the portion of the third connecting portion located on the side, close to the shielding portion, of the transverse centerline of the first connecting portion is aligned with the side edge.

15. The array substrate of claim 2, wherein an orthographic projection of the shielding portion on the array substrate is spaced by 2 micrometers or more from the corresponding thin film transistor.

16. The array substrate of claim 1, wherein the first connecting portion has a connecting body extending in a transverse direction and a connecting end portion that is connected to the connecting body and the first electrode of the thin film transistor and extends in a longitudinal direction; for a case where the shielding portion is located above the first connecting portion, the shielding portion is located above the connecting body.

17. The array substrate of claim 16, wherein an edge of an orthographic projection of the shielding portion on the array substrate is closer to a corresponding gate line, than an edge of an orthographic projection of the connecting body on the array substrate.

18. The array substrate of claim 17, wherein the edge of the orthographic projection of the shielding portion on the array substrate is apart from the corresponding gate line by a third distance; the edge of the orthographic projection of the connecting body on the array substrate is apart from the corresponding gate line by a fourth distance; and a difference between the third distance and the fourth distance is 3 μm-5 μm.

19. A display panel, comprising the array substrate of claim 1.

20. An electronic device, comprising the display panel of claim 19.

* * * * *